(12) United States Patent
Fang et al.

(10) Patent No.: US 9,530,731 B2
(45) Date of Patent: Dec. 27, 2016

(54) METHOD OF OPTICAL PROXIMITY CORRECTION FOR MODIFYING LINE PATTERNS AND INTEGRATED CIRCUITS WITH LINE PATTERNS MODIFIED BY THE SAME

(71) Applicant: UNITED MICROELECTRONICS CORP., Hsin-Chu (TW)

(72) Inventors: Kuan-Wen Fang, Tainan (TW); Chin-Lung Lin, Hsinchu (TW); Kuo-Chang Tien, Tainan (TW); Yi-Hsiu Lee, Chiayi County (TW); Chien-Hsiung Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 3 days.

(21) Appl. No.: 14/607,051

(22) Filed: Jan. 27, 2015

(65) Prior Publication Data

US 2015/0137369 A1 May 21, 2015

Related U.S. Application Data

(63) Continuation of application No. 13/859,718, filed on Apr. 9, 2013, now Pat. No. 8,977,988.

(51) Int. Cl.
*G03F 1/00* (2012.01)
*G06F 17/50* (2006.01)
*H01L 23/528* (2006.01)
*G03F 1/36* (2012.01)
*H01L 23/522* (2006.01)
*H01L 23/532* (2006.01)

(52) U.S. Cl.
CPC ............. *H01L 23/528* (2013.01); *G03F 1/36* (2013.01); *G06F 17/5068* (2013.01); *G06F 17/5077* (2013.01); *H01L 23/5226* (2013.01); *H01L 23/53271* (2013.01); *G03F 1/144* (2013.01); *G06T 2207/30148* (2013.01); *H01L 2924/0002* (2013.01)

(58) Field of Classification Search
CPC ... G03F 1/144; G03F 1/36; G06T 2207/30148
USPC .............................. 716/53, 55; 382/144–145
See application file for complete search history.

(56) References Cited

U.S. PATENT DOCUMENTS

| | | | |
|---|---|---|---|
| 6,033,811 A | 3/2000 | Lee |
| 6,395,438 B1 | 5/2002 | Bruce |
| 6,470,489 B1 | 10/2002 | Chang |
| 6,546,540 B1 | 4/2003 | Igarashi |
| 6,576,486 B2 | 6/2003 | Lin |
| 6,684,382 B2 | 1/2004 | Liu |
| 6,753,115 B2 | 6/2004 | Zhang |

(Continued)

*Primary Examiner* — Stacy Whitmore
(74) *Attorney, Agent, or Firm* — Winston Hsu; Scott Margo

(57) ABSTRACT

A method of optical proximity correction executed by a computer system for modifying line patterns includes the following steps. First, providing an integrated circuit layout with parallel line patterns and interconnect patterns disposed corresponding to the parallel line patterns. Then, using the computer to modify the integrated circuit layout based on a position of the interconnect patterns so as to generate a convex portion and a concave portion respectively on two sides of each of the parallel line patterns. Portions of the line pattern in front of and behind the convex portion and the concave portion are straight lines and have an identical critical dimension.

15 Claims, 2 Drawing Sheets

FIG. 3

(56) References Cited

U.S. PATENT DOCUMENTS

| | | |
|---|---|---|
| 6,763,514 B2 | 7/2004 | Zhang |
| 6,852,453 B2 | 2/2005 | Wu |
| 6,961,920 B2 | 11/2005 | Zach |
| 7,188,322 B2 * | 3/2007 | Cohn ............... G06F 17/5068 716/53 |
| 7,266,801 B2 | 9/2007 | Kotani |
| 7,386,829 B2 | 6/2008 | Lee |
| 7,425,391 B2 | 9/2008 | Zhang |
| 7,434,195 B2 | 10/2008 | Hsu |
| 7,617,475 B2 | 11/2009 | Lin |
| 7,624,369 B2 | 11/2009 | Graur |
| 7,669,153 B2 | 2/2010 | Wu |
| 7,669,170 B2 * | 2/2010 | Cohn ............... G06F 17/5068 716/54 |
| 7,784,019 B1 | 8/2010 | Zach |
| 8,065,652 B1 | 11/2011 | Salowe |
| 8,201,110 B1 | 6/2012 | Gu |
| 8,386,969 B2 | 2/2013 | Hsu |
| 8,627,242 B1 | 1/2014 | Kuo |
| 2005/0081167 A1 | 4/2005 | Kever |
| 2006/0066339 A1 | 3/2006 | Rajski |
| 2006/0080633 A1 * | 4/2006 | Hsu .................. G03F 1/144 430/5 |
| 2006/0085772 A1 | 4/2006 | Zhang |
| 2006/0088772 A1 | 4/2006 | Zhang |
| 2006/0136861 A1 * | 6/2006 | Lucas ............... G06F 17/5068 716/53 |
| 2006/0161452 A1 | 7/2006 | Hess |
| 2006/0195809 A1 * | 8/2006 | Cohn ............... G06F 17/5068 716/53 |
| 2007/0011638 A1 | 1/2007 | Watanabe |
| 2007/0143728 A1 * | 6/2007 | Cohn ............... G06F 17/5068 716/53 |
| 2008/0256504 A1 | 10/2008 | Oishi |
| 2008/0270969 A1 * | 10/2008 | Wu ..................... G03F 1/144 716/55 |
| 2009/0193385 A1 | 7/2009 | Yang |
| 2009/0271759 A1 | 10/2009 | Torres Robles |
| 2009/0278569 A1 | 11/2009 | Taoka |
| 2009/0300576 A1 | 12/2009 | Huang |
| 2010/0036644 A1 | 2/2010 | Yang |
| 2010/0070944 A1 | 3/2010 | Wu |
| 2010/0086862 A1 | 4/2010 | Yang |
| 2010/0115765 A1 | 5/2010 | Hamamoto |
| 2010/0131914 A1 | 5/2010 | Wu |
| 2010/0175041 A1 | 7/2010 | Krasnoperova |
| 2011/0029939 A1 | 2/2011 | Yang |
| 2011/0294263 A1 | 12/2011 | Ogawa |
| 2012/0185807 A1 | 7/2012 | Tsai |
| 2013/0086541 A1 | 4/2013 | Luo |
| 2013/0207198 A1 | 8/2013 | Becker |

* cited by examiner

METHOD OF OPTICAL PROXIMITY CORRECTION FOR MODIFYING LINE PATTERNS AND INTEGRATED CIRCUITS WITH LINE PATTERNS MODIFIED BY THE SAME

CROSS REFERENCE TO RELATED APPLICATIONS

This application is a continuation of U.S. application Ser. No. 13/859,718, filed on Apr. 9, 2013, which is incorporated herein by reference in its entirety.

BACKGROUND OF THE INVENTION

1. Field of the Invention

The present invention relates generally to the field of optical proximity correction (OPC), and, more particularly, to an optical proximity correction method for increasing the overlapping area between interconnect patterns and line patterns.

2. Description of the Prior Art

In the fabrication of semiconductors, semiconductor devices are connected by multiple interconnect layers at different levels. Interlayer connections of various conductive layers are achieved by interconnection means such as vias or contacts. Accordingly, in the design of integrated circuit (IC) layout for each level, it is essential to consider the interconnect relation and the layout alignment of upper and lower levels as well as the limitations induced by process capability. However, as the scale of integration for nowadays electronic devices continues to shrink, the critical dimension (CD) required for semiconductor devices becomes smaller. In this condition, it is quite difficult to design layouts having necessary critical dimensions for every component while still maintaining a precise alignment of the layouts and reliable interconnections between the conductive layers.

SUMMARY OF THE INVENTION

To meet the demand of reliable interconnections for nowadays semiconductor devices, a method of optical proximity correction is provided in the present invention which may modify the original layout pattern, such as a line pattern, to achieve a precise alignment of the interconnect structures between upper and lower layers while still maintaining the critical dimension uniformity (CDU) of the device pattern and providing a sufficient process window, ex. a PR window.

A method of optical proximity correction executed by a computer system is provided according to one embodiment of the present invention and includes the following steps: first, providing an integrated circuit layout with parallel line patterns and interconnect patterns disposed corresponding to the parallel line patterns; then, using the computer to modify the integrated circuit layout based on a position of the interconnect patterns so as to generate a convex portion and a concave portion respectively on two sides of each of the parallel line patterns. Portions of the line pattern in front of and behind the convex portion and the concave portion are straight lines and have an identical critical dimension.

Also, another method of optical proximity correction executed by a computer system is provided according to another embodiment of the present invention and includes the following steps: providing an integrated circuit layout with parallel line patterns; then, using the computer system to modify the integrated circuit layout by forming a convex portion and a corresponding concave portion respectively on both sides of the line pattern based on a position of an interconnect pattern of another integrated circuit layout. The interconnect pattern is stacked on the parallel line patterns, and portions of the line pattern in front of and behind the convex portion and the concave portion are straight lines and have an identical critical dimension.

An integrated circuit with an integrated circuit layout is provided according to still another embodiment of the present invention. The integrated circuit layout includes line patterns and an interconnect pattern stacked on the line pattern. At least one of the line patterns has a convex portion and a corresponding concave portion. Portions of the line pattern in front of and behind the convex portion and the concave portion are straight lines and have an identical critical dimension.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
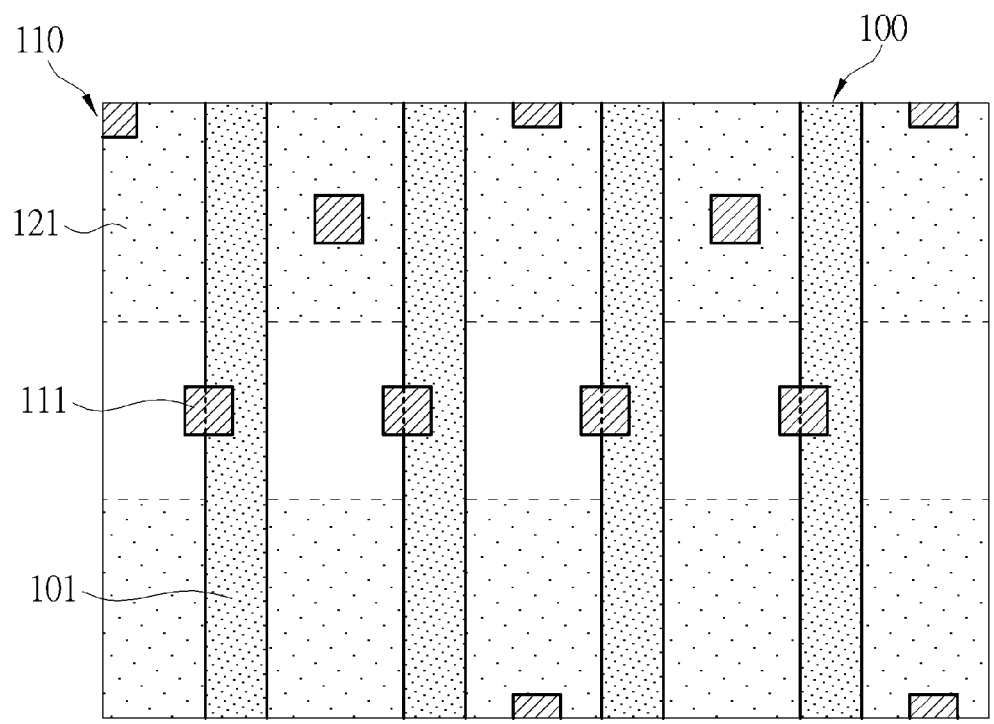
FIG. 1 is a top view schematically illustrating the deviation condition between upper interconnect patterns and lower line patterns.

It should be noted that all the figures are diagrammatic. Relative dimensions and proportions of parts of the drawings have been shown exaggerated or reduced in size, for the sake of clarity and convenience in the drawings. The same reference signs are generally used to refer to the same features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer to FIG. 1, which schematically illustrates the deviation between an upper interconnect pattern and a lower interconnect pattern. Two stacked integrated circuit (IC) layouts are shown in FIG. 1, wherein one is a lower layout 100 denoted by dot patterns, and the other is an upper layout 110 denoted by hatched patterns. The lower layout 100 includes a plurality of parallel line patterns 101 along a first direction. The upper layout 110 includes a plurality of interconnect patterns 111. In real processes, the lower layout 100 and upper layout 110 may be pre-designed photomask patterns involved in hundreds of photolithographic steps of semiconductor process flow. The layout 100 and 110 may be stored in a computer readable medium and to be used in the fabrication of photomask. The photomask with layout 100 or 110 can be used in dozen of to hundreds of photolithographic processes to form photoresist with predetermined patterns. The photoresist may then be used in etch processes as an etch mask to form patterned semiconductor structures. For example, the line pattern 101 of layout 100 may be used to form poly-Si lines or metal lines which may serve as a gate structure. The interconnect pattern 111 may be used to form contacts or vias which connect an upper layer and a lower layer. Additionally, active regions 121 are shown in FIG. 1 to serve as the source/drain of the semiconductor devices, wherein a number of interconnect patterns 111 are stacked on line patterns 101, and a number of interconnect patterns 111 are stacked on the active regions 121. Preferably, the interconnect patterns 111 stacked on line patterns are disposed outside the active regions 121 of the integrated circuit.

With regard to process requirement and alignment deviation, some design rules allow the interconnect pattern to exceed the extent of underlying line pattern, as shown in FIG. 1. In this scheme, the interconnect pattern 111 is not completed stacked on the line pattern 101. A slight alignment deviation exists therebetween. This kind of overhung interconnect feature is usually observed in layout schemes with extreme small critical dimension (CD), in which the upper and lower layouts can't be precisely aligned. Although this kind of incomplete stack is allowed by the design rule, there are trade-offs in the performance of the resulting semiconductor devices. For example, an incomplete stacking may induce leakage problems and worse process windows.

Figure 2:
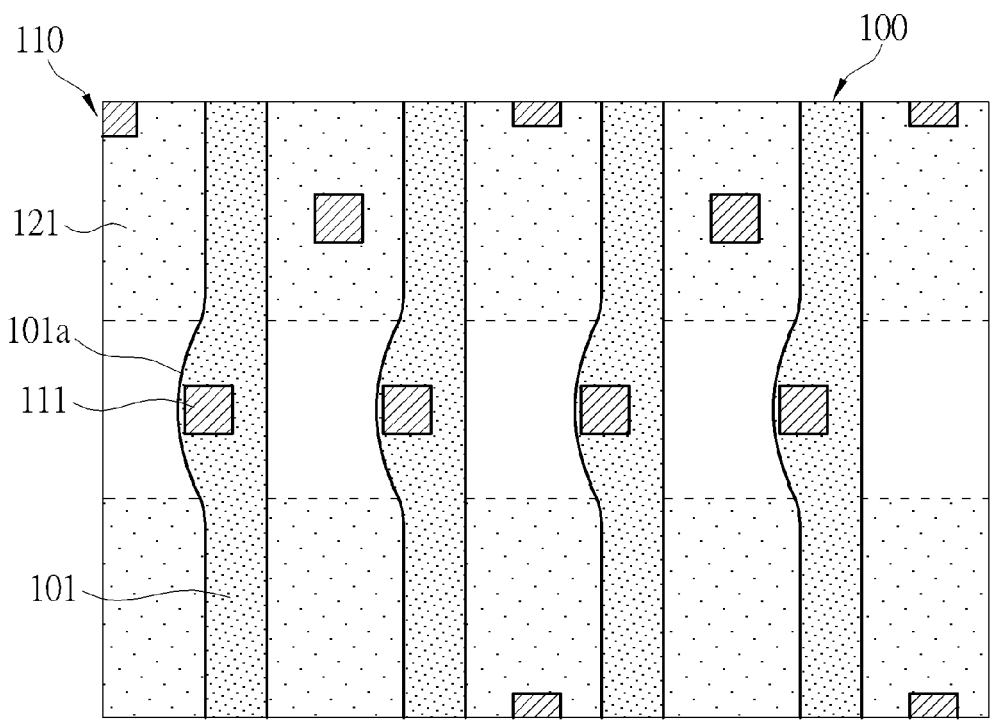
FIGS. 2-3 are top views schematically illustrating the steps of the optical proximity correction method in accordance with one preferred embodiment of the present invention.

Please refer to FIG. 2. Since a deviation may inevitably occurs between the stacked interconnect pattern 111 and the line pattern 101, the solution of present invention is to modify the original line pattern 101 through optical proximity correction (OPC) without changing relative positions of original interconnect patterns, to form a convex portion 101a at one side of the line pattern 101 where the interconnect pattern 111 deviates. For example, in the first preferred embodiment shown in FIG. 2, the convex portion 101a is a smooth and arched line segment. The extent and curvature of the convex portion 101a is determined by the critical dimension and the deviation value of the interconnect pattern 111. The line pattern 101 with the convex portion 101a should cover the entire interconnect pattern 111, so that the interconnect pattern 111 may be completely stacked on the line pattern 101. The above-mentioned OPC method may be executed by a computer system, for example, by a OPC software which process the information of layout stored in the computer readable medium according some specific algorithms to modify the patterns.

Even though the problems of incomplete stacking and alignment may be solved by the above-mentioned approach of forming convex portions 101a, other problems may successively occur. For example, since the local critical dimension of the convex portion 101a is larger than the original critical dimension of the line pattern 101, the critical dimension uniformity (CDU) of the line patterns 101 may decrease. Furthermore, since the line pattern 101 with convex portion 101a is no longer a regular straight line, it is prone to induce hot spots in the photoresist formed by the line patterns, thereby lowering the process window of the photolithographic process. Besides, when the spacing between the line patterns 101 is small, the convex portion 101a is prone to short the nearest line pattern 101.

Figure 3:
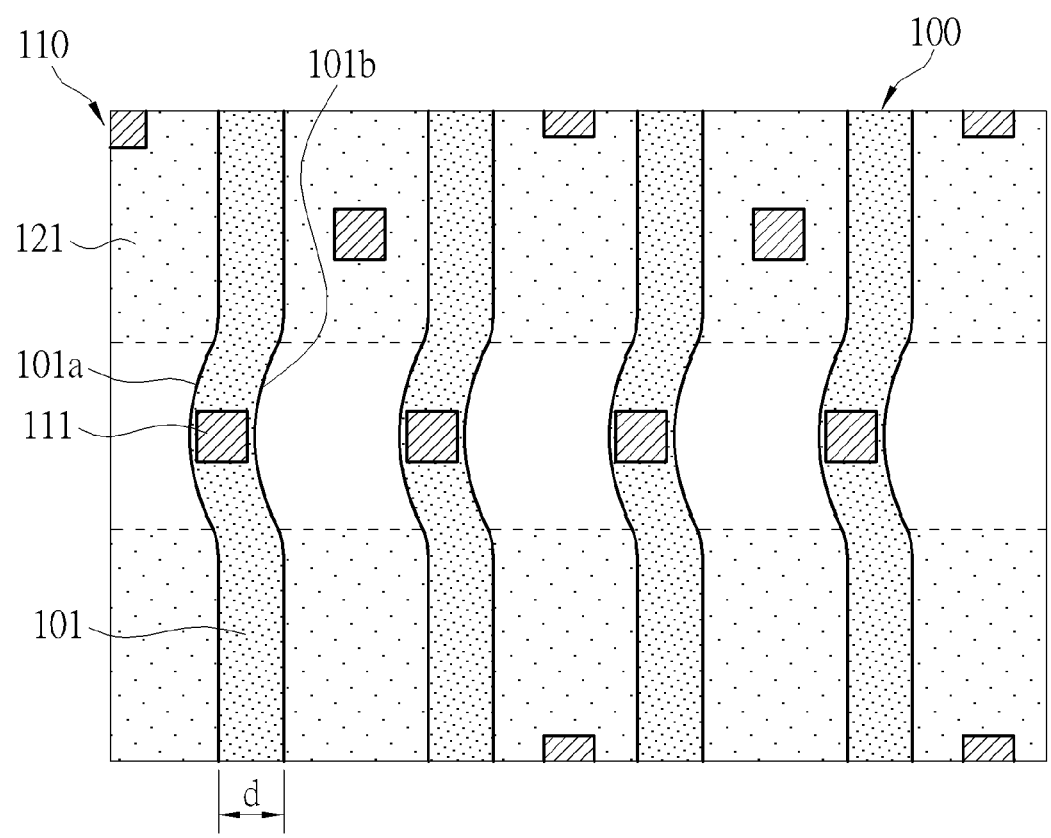

To resolve the above-mentioned problem, please refer to FIG. 3, a second preferred embodiment is further provided in present invention. In this embodiment, line pattern 101 is modified again by optical proximity correction to form a concave portion 101b corresponding to each convex portion 101a at the other side of the line pattern 101, without changing relative positions of original interconnect patterns 111. The convex portion 101a and concave portion 101b are smooth and arched line segments. The extent and curvature of the concave portion 101b is determined by the critical dimension and the deviation value of the interconnect pattern 111, such that the line pattern 101 between the convex portion 101a and the concave portion 101b covers the entire interconnect pattern 111. In this way, the interconnect pattern 111 may be completely stacked on the line pattern 101. Please note that the OPC method of present invention is not limited in the condition that the interconnect pattern is stacked on the line pattern. The method of present invention is also adapted in the condition that the line pattern is stacked on the interconnect pattern.

The advantages of OPC method of the present invention is: by modifying the original straight line pattern into a line pattern with convex portions and corresponding concave portions correlative to the deviation value of the interconnect pattern, the incomplete stacking and misalignment of integrated circuit layouts may be easily solved, while still maintaining the default CD and process window of the line pattern.

According to the above-disclosed OPC method, please refer again to FIG. 3, an integrated circuit layout formed by the same is therefore provided in the present invention, which comprises a plurality of line patterns 101. Each line pattern is provided with a convex portion 101a and a corresponding concave portion 101b, wherein the portions of line pattern 101 in front of and behind the convex portion 101a and the concave portion 101b are still straight lines along the same direction and have an identical critical dimension d. An interconnect pattern is stacked on the line pattern 101 between the convex portion 101a and the concave portion 101b.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of optical proximity correction executed by a computer system, comprising the steps of:

providing an integrated circuit layout with a plurality of parallel line patterns and a plurality of interconnect patterns disposed corresponding to the parallel line patterns;

using the computer to modify the integrated circuit layout based on a position of the interconnect patterns so as to generate a convex portion and a concave portion respectively on two sides of each of the parallel line patterns, wherein portions of the parallel line pattern in front of and behind the convex portion and the concave portion are straight lines along a same direction and have an identical critical dimension, the concave portion is generated based on the position of the interconnect pattern.

2. The method of optical proximity correction executed by a computer system according to claim 1, further comprising stacking the interconnect patterns on the parallel line patterns after the step of using the computer to modify the integrated circuit layout based on the position of the interconnect patterns.

3. The method of optical proximity correction executed by a computer system according to claim 1, wherein each of the convex portions overlaps a corresponding one of the interconnect patterns.

4. The method of optical proximity correction executed by a computer system according to claim 1, wherein the interconnect patterns are outside an active region of the integrated circuit layout.

5. The method of optical proximity correction executed by a computer system according to claim 1, wherein the concave portions are formed based on a critical dimension uniformity of the parallel line patterns.

6. The method of optical proximity correction executed by a computer system according to claim 5, wherein the critical dimension uniformity of the parallel line patterns is maintained during the step of forming the concave portions.

7. A method of optical proximity correction executed by a computer system, comprising the steps of:
    providing an integrated circuit layout with a plurality of parallel line patterns; and
    using the computer system to modify the integrated circuit layout by forming a convex portion and a corresponding concave portion respectively on both sides of the line pattern so that both the convex portion and the corresponding concave portion are formed based on a position of an interconnect pattern of another integrated circuit layout, wherein the interconnect pattern is stacked on the parallel line patterns, and portions of the line pattern in front of and behind the convex portion and the concave portion are straight lines along a same direction and have an identical critical dimension.

8. The A method of optical proximity correction executed by a computer system according to claim 7, wherein the step of using the computer system to modify the integrated circuit layout is performed when a position of the interconnect pattern is deviated from the parallel line patterns.

9. The method of optical proximity correction executed by a computer system according to claim 7, wherein the interconnect patterns are outside an active region of the integrated circuit layout.

10. The method of optical proximity correction executed by a computer system according to claim 7, wherein the corresponding concave portion is formed based on a critical dimension uniformity of the parallel line patterns.

11. The method of optical proximity correction executed by a computer system according to claim 10, wherein the critical dimension uniformity of the parallel line patterns is maintained during the step of forming the corresponding concave portion.

12. An integrated circuit comprising an integrated circuit layout, wherein the integrated circuit layout comprises:
    a plurality of line patterns, wherein at least one of the line patterns has a convex portion and a corresponding concave portion, wherein portions of the line pattern in front of and behind the convex portion and the concave portion are straight lines along a same direction and have an identical critical dimension; and
    an interconnect pattern stacked on the line pattern, wherein the interconnect pattern is outside an active region of the integrated circuit.

13. The integrated circuit according to claim 12, wherein the line patterns are poly-Si line patterns.

14. The integrated circuit according to claim 12, wherein the interconnect pattern is a via pattern or a contact pattern.

15. The integrated circuit according to claim 12, wherein the interconnect pattern at least partially overlaps the convex portion.

* * * * *